(12) United States Patent
Chern et al.

(10) Patent No.: US 9,531,350 B2
(45) Date of Patent: Dec. 27, 2016

(54) LEVEL SHIFTERS FOR IO INTERFACES

(71) Applicant: TAIWAN SEMICONDUCTOR MANUFACTURING COMPANY, LTD., Hsinchu (TW)

(72) Inventors: Chan-Hong Chern, Palo Alto, CA (US); Fu-Lung Hsueh, Cranbury, NJ (US); Chih-Chang Lin, San Jose, CA (US); Yuwen Swei, Fremont, CA (US); Ming-Chieh Huang, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/859,413

(22) Filed: Apr. 9, 2013

(65) Prior Publication Data

US 2013/0222015 A1    Aug. 29, 2013

Related U.S. Application Data

(63) Continuation of application No. 12/859,456, filed on Aug. 19, 2010, now Pat. No. 8,436,671.

(51) Int. Cl.
   H03K 19/0185    (2006.01)
   H03K 3/02       (2006.01)

(52) U.S. Cl.
   CPC ........ *H03K 3/02* (2013.01); *H03K 19/018521* (2013.01); *H03K 19/018528* (2013.01)

(58) Field of Classification Search
   CPC .............. H03K 3/02; H03K 19/018521; H03K 19/018528
   USPC ....................................... 327/333; 326/80, 81
   See application file for complete search history.

(56) References Cited

U.S. PATENT DOCUMENTS

| | | | |
|---|---|---|---|
| 4,656,372 A | 4/1987 | Sani et al. | |
| 5,311,082 A | 5/1994 | Lam | |
| 5,463,329 A | 10/1995 | Kawasaki et al. | |
| 6,175,249 B1 | 1/2001 | Goodell | |
| 6,593,774 B2 | 7/2003 | Li | |
| 6,784,690 B2 * | 8/2004 | Tran et al. | 326/30 |
| 7,696,805 B2 * | 4/2010 | Thorp et al. | 327/333 |
| 7,710,182 B2 * | 5/2010 | Yu et al. | 327/333 |
| 7,768,308 B2 * | 8/2010 | Maede et al. | 326/68 |
| 7,863,962 B2 * | 1/2011 | Pasqualini | 327/333 |
| 7,884,646 B1 | 2/2011 | Bourstein | |

* cited by examiner

*Primary Examiner* — Kenneth B Wells
(74) *Attorney, Agent, or Firm* — Hauptman Ham, LLP

(57) ABSTRACT

An integrated circuit which includes a pre-driver configured to receive a first high supply voltage and to generate an input signal and at least one post-driver configured to receive at least one second high supply voltage and to receive the input signal. The at least one post-driver includes an input node configured to receive the input signal and an output node configured to output an output signal. The at least one post-driver further includes a pull-up transistor configured to be in a conductive state during an entire period of operation, and a pull-down transistor. The at least one post-driver further includes at least one diode-connected device coupled between the pull-down transistor and the output node. Each post-driver of the at least one post-driver is configured to supply the output signal having a second voltage level corresponding to a high logic level which is higher than an input voltage level.

15 Claims, 7 Drawing Sheets

LEVEL SHIFTERS FOR IO INTERFACES

CROSS REFERENCE TO RELATED APPLICATIONS

This application is a continuation of U.S. Pat. No. 8,436,671, filed Aug. 19, 2010, which is incorporated herein by reference in its entirety.

TECHNICAL FIELD

The present disclosure relates generally to an integrated circuit, more particularly a level shifter architecture or system.

BACKGROUND

To reduce power consumption and enhance the performance per unit area, some integrated circuits, e.g., central processing unit (CPU), graphics processing unit (GPU), system on chip (SOC), have reduced the core operating voltage, while the surrounding chips or peripheral circuits, e.g., input-output (TO), still operate at higher voltages due to legacy and/or for backward compatibility. Level shifting is used to accommodate voltage differences from the core logic to the IO interfaces.

In order to improve the speed and lower the power consumption, it may be desirable for some IO interfaces to have a low voltage output (VOL), which is higher than 0.2 times the high-side power supply voltage (Vddhi) and/or a high voltage output (VOH), which is lower than 0.8 times Vddhi. Also, a level shifter without complicated bias circuits providing a constant bias may be desirable.

Accordingly, new circuits and methods are desired to solve the above problems.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
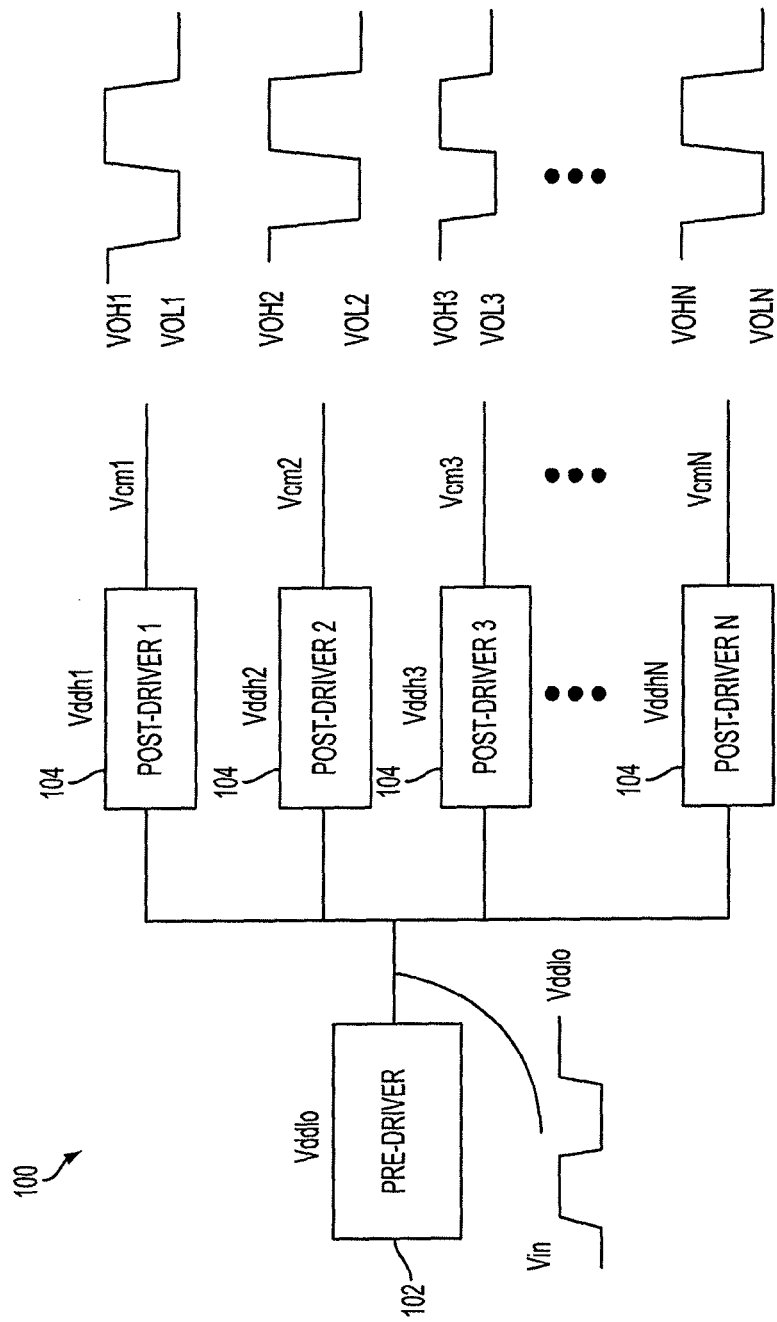
FIG. 1 is a schematic diagram showing an exemplary multi-protocol IO interface according to some embodiments.

FIG. 1 is a schematic diagram showing an exemplary multi-protocol IO interface according to some embodiments. The signal, e.g., Vin, in low power supply voltage domain (core circuit power supply voltage domain), from a pre-driver 102 has a lower power supply voltage level, i.e., Vddlo, compared to post-drivers 104. Post-drivers 104 have a higher power supply voltage level, e.g., Vddh1, Vddh2, . . . , VddhN. Post-drivers 104 receive an input signal Vin with a lower voltage level, e.g., Vddlo, and level-shift the signals for multiple IO interfaces having different IO protocols with different VOH (output high voltage), VOL (output low voltage), and Vcm (output common mode, i.e., a middle point between VOH and VOL), e.g., VOH1, VOH2, . . . , VOHN; VOL1, VOL2, . . . , VOLN; Vcm1, Vcm2, . . . , VcmN. The post-drivers 104 can generate different VOH, VOL, and Vcm voltages using level shifters and can also include buffers for the next stages.

Figure 2:
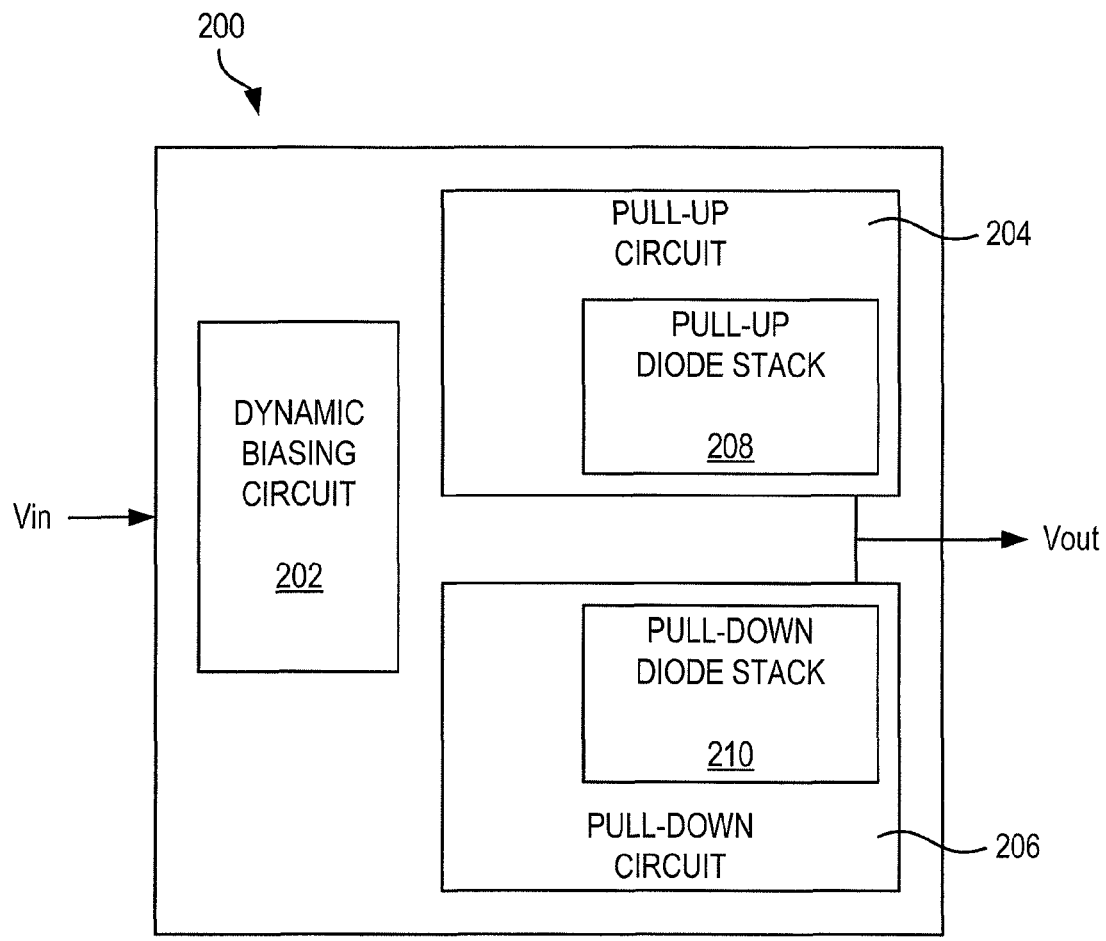
FIG. 2 is a schematic diagram showing an exemplary level shifter structure for the IO interface of FIG. 1 according to some embodiments.

FIG. 2 is a schematic diagram showing an exemplary level shifter structure for the IO interface of FIG. 1 according to some embodiments. The level shifter structure 200 can provide different levels of VOH, VOL, and Vcm. The level shifter structure 200 includes a pull-up circuit 204, a pull-down circuit 206, a dynamic biasing circuit 202, a pull-up diode stack 208, and a pull-down diode stack 210. The pull-up circuit 204 can include, e.g., a pull-up PMOS transistor, that pulls up the output signal Vout to a logical 1. The pull-down circuit 206 can include, e.g., a pull-down NMOS transistor, that pulls down the output signal Vout to a logical 0.

The dynamic biasing circuit 202 can provide a flexible bias voltage for the pull-up circuit 204 or the pull-down circuit 206 to help the pull-up or pull-down function, e.g., it can turn on or turn off a pull-up PMOS transistor. The pull-up diode stack 208 and the pull-down diode stack 210 can include one or more diode-connected devices, e.g., diode-connected PMOS transistors or diode-connected NMOS transistors. The pull-up diode stack 208 and pull-down diode stack 210 have diode voltage drops across them when an electric current is flowing. The pull-up diode stack 208 allows the Vout to be pulled up to the level shifter 200's power supply voltage level (e.g., Vddh1, Vddh2, . . . , VddhN in FIG. 1) minus its diode voltage drop (i.e., the diode voltage drop below the power supply voltage level). The pull-down diode stack 210 allows the Vout to be pulled down to the ground plus its diode voltage drop (i.e., the diode voltage drop above the ground).

Figure 3:
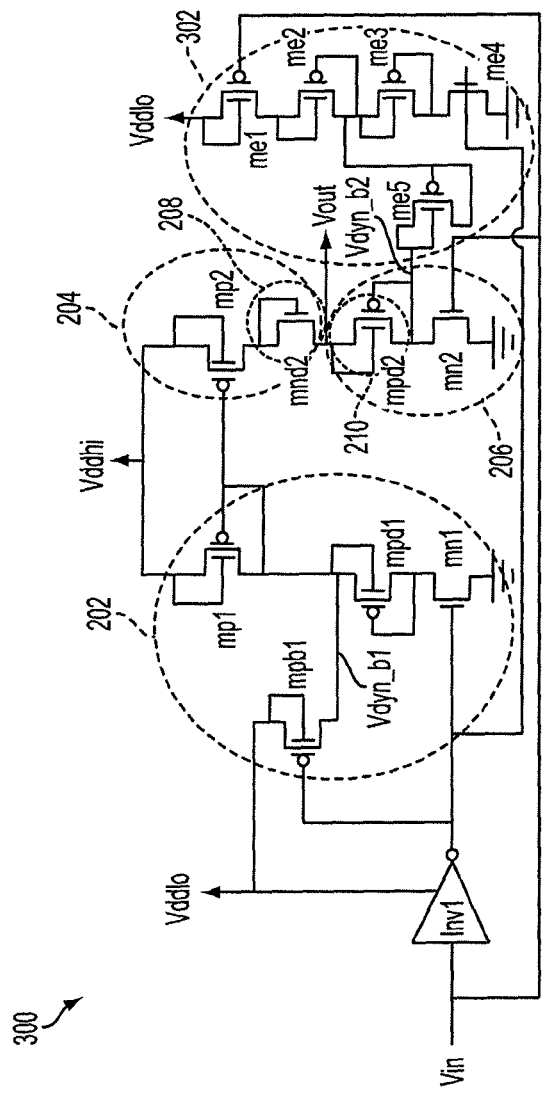
FIG. 3 is a schematic diagram showing an exemplary level shifter circuit of FIG. 2 according to some embodiments.

FIG. 3 is a schematic diagram showing an exemplary level shifter circuit of FIG. 2 according to some embodiments. The level shifter circuit 300 level-shifts signals from core logic circuits, e.g., Vin, to IO signals, e.g., Vout, for multi-protocol IO interfaces. In some core logic circuits, the power supply voltage Vddlo can be about 1.0 V or below. The IO interfaces can be at higher voltage power domains, such as 1.5 V, 1.8 V, 2.5 V, 3.3 V, etc.

The circuit 300 can supply a VOL that is one diode voltage drop (of the diode-connected device, e.g., PMOS transistor mpd2) above the low power supply voltage, e.g., ground, when the Vout is pulled down. The circuit 300 can also supply a VOH that is Vddhi minus one diode voltage drop (of the diode-connected device, e.g., NMOS transistor mnd2), when the Vout is pulled up. Even though the diode-connected PMOS transistor mpd2 and the diode-connected NMOS transistor mnd2 are used in specific positions in the circuit 300, the diode-connected PMOS transistor and the diode-connected NMOS transistor can be used as a diode-connected device (that induces a diode voltage drop) for either the pull-up circuit 204 or the pull-down circuit 206.

When the input signal Vin is a logical 1, the pull-down NMOS transistor mn2 in the pull-down circuit 206 is turned on and pulls down Vout. Also, the inverted signal after the inverter Inv1 is a logical 0, which turns on the PMOS transistor mpb1 and turns off the NMOS transistor mn1 in the dynamic biasing circuit 202. This brings the bias voltage Vdyn_b1 to Vddlo, which slightly (i.e., not fully) turns on the pull-up PMOS transistor mp2 in the pull-up circuit 204, because its source voltage at Vddhi is higher than its gate voltage at Vddlo. This allows a limited bias current flow through the diode-connected device, i.e., the PMOS transistor mpd2, to have Vout at a diode voltage drop (across the diode-connected PMOS transistor mpd2) above ground, instead of ground.

When the input signal Vin is a logical 0, the pull-down NMOS transistor mn2 in the pull-down circuit 206 is turned off. Also, the inverted signal after the inverter Inv1 is a logical 1, which turns off the PMOS transistor mpb1 and turns on the NMOS transistor mn1 in the dynamic biasing circuit 202. This brings the bias voltage Vdyn_b1 to be in-between Vddhi and ground, determined by the resistance ratio of the diode-connected PMOS transistor mp1 and mpd1. Note that the diode-connected mpd1 is for preventing electrical overstress (EOS) on transistor mn1 if thin-gate-dielectric transistors are used for the level-shifter implementation. If thick-gate transistors are used and there is no EOS issues, mpd1 is optional. When the size of the diode-connected PMOS transistor mpd1 is bigger than mp1, its resistance is smaller, and Vdyn_b1 will be closer to ground. This strongly turns on the pull-up PMOS transistor mp2 in the pull-up circuit 204, which pulls up Vout to Vddhi minus the diode voltage drop (across the diode-connected NMOS transistor mnd2), instead of Vddhi.

An electrical over-stress (EOS) prevention bias circuit 302 supplies a bias voltage Vdyn_b2 so that the pull-down NMOS transistor mn2 is protected when Vout is a logical 1 (and Vin a logical 0). With Vin at a logical 0, a PMOS transistor me1 and NMOS transistor me4 are turned on in the EOS prevention bias circuit 302. Thus, Vddlo is divided between the two diode-connected PMOS transistors me2 and me3, and Vdyn_b2 is controlled at two diode voltage drop (across diode-connected PMOS transistors me3 and me5) above ground to prevent over stress on the pull down NMOS transistor mn2.

Embodiments of the level shifter 300 can generate various VOH and VOL for multi-protocol IO interfaces, e.g., higher or lower, by using different threshold voltages (Vt) for the diode-connected devices, e.g., low threshold voltage (LVT), standard threshold voltage (SVT), high threshold voltage (HVT), thereby changing the diode voltage drop across the diode-connected devices.

In one embodiment with Vddhi=1.5 V and Vddlo=1 V, VOH/VOL=1.50 V/0.34 V was achieved, where VOL was raised from ground by one LVT, e.g., 0.34 V. Therefore, VOL, e.g., 0.34 V, greater than 0.2 times Vddhi (1.5 V) was achieved by level shifting. In another embodiment with Vddhi=1.5 V and Vddlo=1 V, VOH/VOL=1.50 V/0.60 V was achieved, where VOL was raised from ground by one HVT, e.g., 0.60 V.

In yet another embodiment with Vddhi=1.5 V and Vddlo=1 V, VOH/VOL=1.16 V/0.47 V was achieved, where VOH was lowered from Vddhi by one LVT, e.g., 0.34 V, while VOL was raised from ground by one SVT, e.g., 0.45 V. Therefore, VOH, e.g., 1.16 V, lower than 0.8 times Vddhi (1.5 V) was achieved by level shifting. In another embodiment with Vddhi=1.8 V and Vddlo=1 V, VOH/VOL=1.80 V/0.78 V was achieved, where VOL was raised from ground by two LVT, e.g., 0.78 V.

Also, the level shifter 300 can generate various VOH and VOL for multi-protocol IO interfaces, e.g., higher or lower, by using multiple diode connected device stacks for both pull-up and pull-down circuits. For example, even though the circuit 300 in FIG. 3 shows only a single diode-connected PMOS transistor mpd2, the VOL level can be further varied by stacking multiple diode-connected devices such as PMOS transistors mpd2, e.g., 2, 3 . . . etc., thereby increasing the total diode voltage drop across the diode-connected devices. In some embodiments, the VOL level can be higher than 0.2 times Vddhi.

Also, even though the circuit 300 shows only a single diode-connected NMOS transistor mnd2, the VOH level can be also further varied stacking multiple diode-connected devices such as NMOS transistor mnd2, e.g. 2, 3 . . . etc. In some embodiments, the VOH level can be lower than 0.8 times Vddhi.

Figure 4:
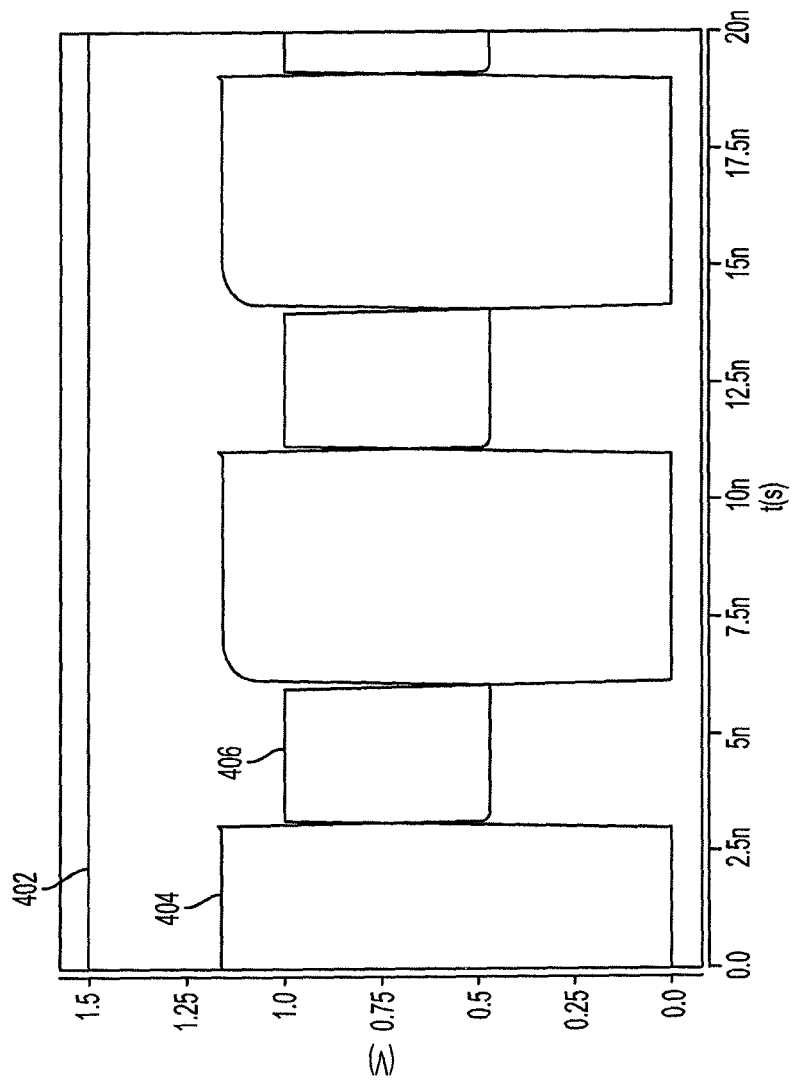
FIG. 4 is a plot showing waveforms for the exemplary level shifter circuit of FIG. 3 according to some embodiments.

FIG. 4 is a plot showing waveforms for the exemplary level shifter circuit of FIG. 3 according to some embodiments. Vddhi 402 shows the high power supply voltage level Vddhi at 1.5 V. The Vout 404 shows a voltage range of about 0.5 V (VOL)–1.15 V (VOH), compared to Vin 406 with a voltage range of about 0 V–1 V. By using the diode-connected devices, e.g., PMOS transistor mpd2 and NMOS transistor mnd2, VOL is raised from ground by 0.5 V (higher than 20% of Vddhi) and VOH is lowered from Vddhi by 0.35 V (lower than 80% of Vddhi), respectively.

Figure 5:
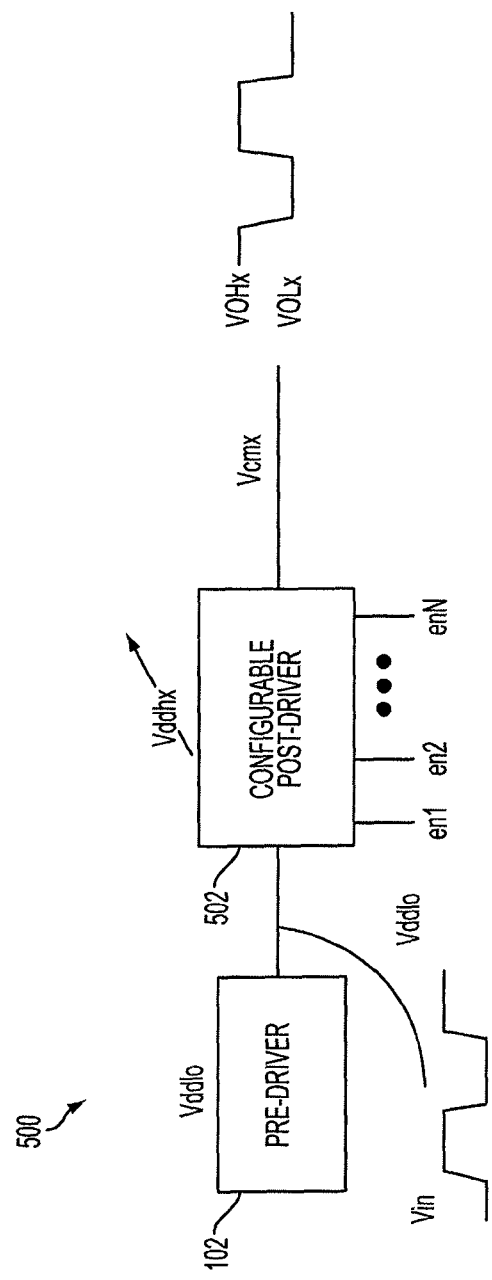
FIG. 5 is a schematic diagram showing another exemplary multi-protocol IO interface with configurable voltage level according to some embodiments.

FIG. 5 is a schematic diagram showing another exemplary multi-protocol IO interface with configurable voltage level according to some embodiments. The signal in low power supply voltage domain (core circuit power supply voltage domain) from a pre-driver 102 has a lower power supply voltage level, i.e., Vddlo, compared to a single post-driver 502. The post-driver 502 can be supplied with different high power supply voltage levels, e.g., Vddhx, that can be varied to many values, e.g., Vddh1, Vddh2 . . . VddhN.

The post driver 502 receives the input signal Vin at Vddlo level and level-shifts for a different IO interface having a different IO protocol with a different VOHx (variable output high voltage), VOLx (variable output low voltage), and Vcmx (variable output common mode). For instance, the post-driver 502 needs to support both 1.5V and 1.8V IO interfaces. Thus, the Post-driver 502 has a capability of generating configurable (variable) VOH, VOL, and Vcm voltage using a level shifter, such as the circuit 600 shown in FIG. 6.

Figure 6:
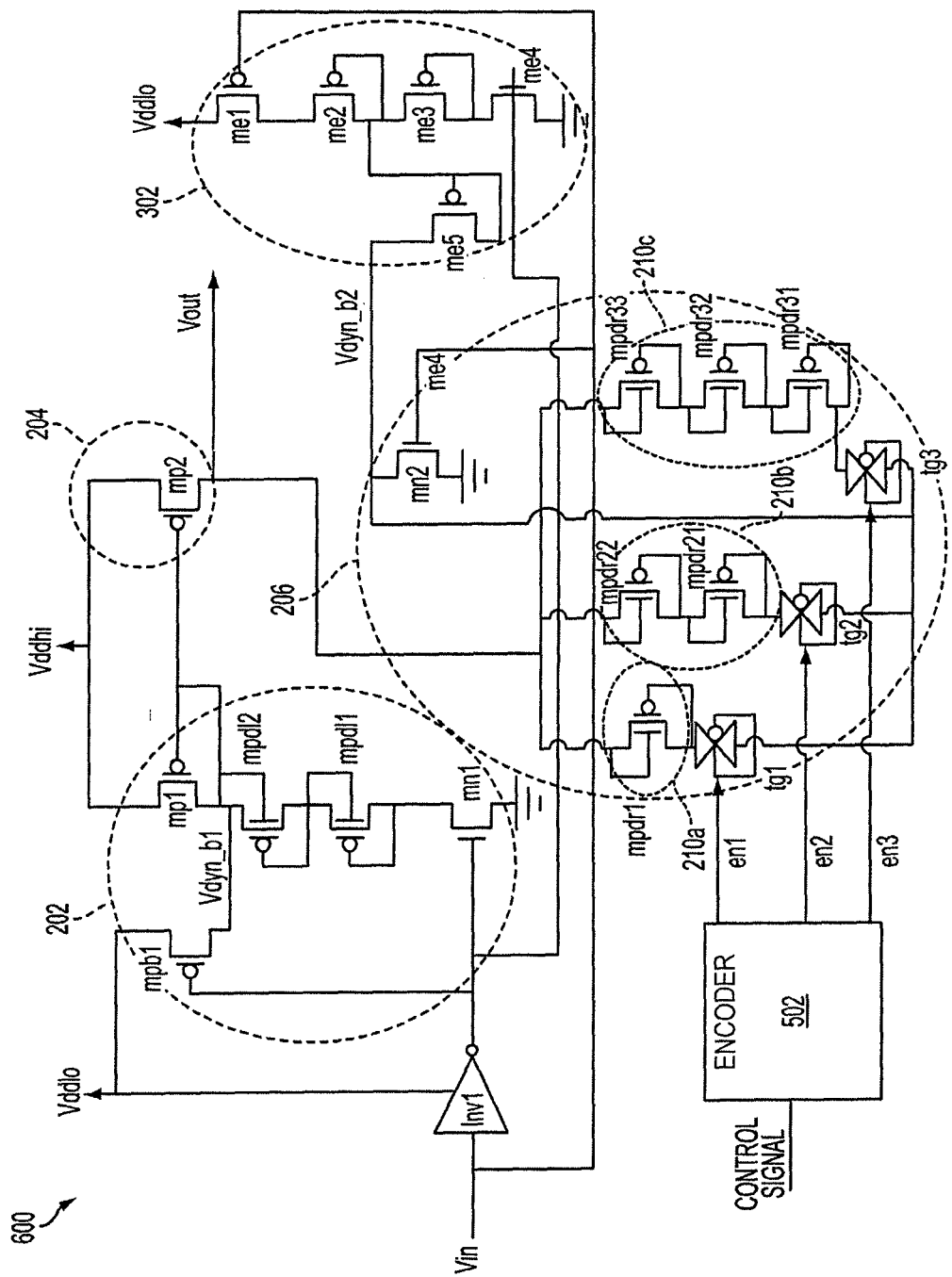
FIG. 6 is a schematic diagram showing an exemplary configurable level shifter circuit for FIG. 5 according to some embodiments.

FIG. 6 is a schematic diagram showing an exemplary configurable level shifter circuit for FIG. 5 according to some embodiments. Various VOLs and VOHs can be generated by the configurable level shifter 600 that has similar structure as the level shifter 300 in FIG. 3, except that instead of a single set of pull-down diode stack 210, there are three sets of pull-down diode stacks 210a, 210b, and 210c.

A control signal (e.g. a 2-bit data signal) can be supplied to control transmission gates (switches) tg1, tg2, and tg3, through a encoder 502 that generates enable signals en1, en2, and en3, which enables only one set of pull-down diode stack. Each of the pull-down diode stacks 210a, 210b, and 210c has a different number of diode-connected devices, e.g., 1, 2, and 3, respectively, thus the diode voltage drop of the pull-down diode stack can be changed depending on which stack is selected. Therefore, when Vout is pulled down, Vout can have different diode voltage drops above ground as VOL, depending on the selection of the pull-down voltage stack. Also, the VOL level can be varied using different Vt (threshold voltage) for the diode-connected devices, mpdr1, mpdr21-mpdr22, mpdr31, mpdr32, and mpdr33.

In one embodiment of the circuit 600 with Vddhi=1.5V, VOH/VOL=1.5 V/0.60 V was achieved, when the pull-down diode stack 210a was chosen, having one HVT diode voltage drop at 0.60 V (more than 20% of Vddhi). In another embodiment with Vddhi=1.8 V, VOH/VOL=1.8 V/0.78 V was achieved, when the pull-down diode stack 210b was chosen, having two LVT diode voltage drop at 0.78 V. In that embodiment, when the pull-down stack 210c was chosen, having three LVT diode voltage drop, VOH/VOL=1.8 V/1.05 V was achieved.

Even though the circuit 600 only shows configurable pull-down diode stacks, a similar structure can be used for pull-up diode stacks (not shown) for choosing one from various pull-up diode stacks, thus have different VOH (Vddhi minus the diode voltage drop from the chosen pull-up diode stack). Also, the VOH level can be varied using different Vt for the diode-connected devices in the pull-up diode stacks, and VOH less than 80% Vddhi can be achieved in some embodiments.

Figure 7:
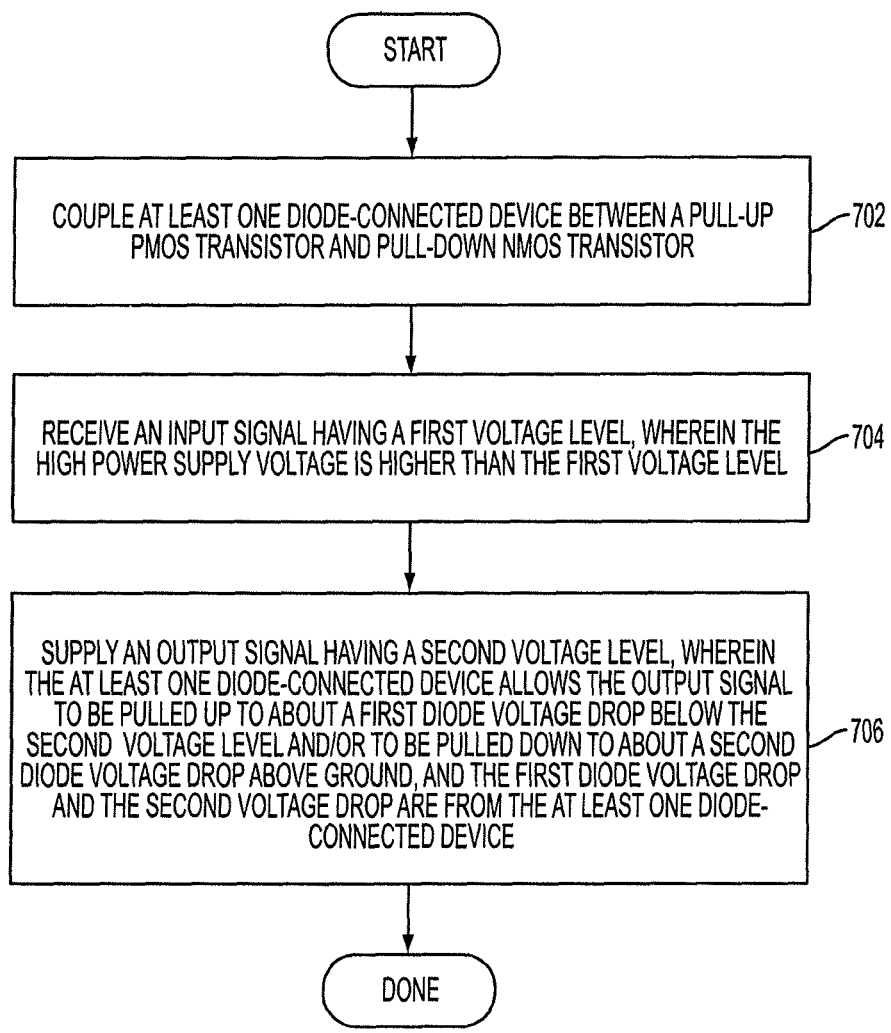
FIG. 7 is a flowchart for a method of a level shifter for the exemplary multi-protocol IO interface in FIG. 1 and/or FIG. 5 according to some embodiments.

FIG. 7 is a flowchart for a method of a level shifter for the exemplary multi-protocol IO interface in FIG. 1 and/or FIG. 5 according to some embodiments. The level shifter is coupled to a high power supply voltage, e.g., Vddhi.

At step 702, at least one diode-connected device, e.g., mnd2 and/or mpd2, is coupled between a pull-up PMOS transistor, e.g., mp2, and a pull-down NMOS transistor, e.g., mn2.

At step 704, an input signal, e.g., Vin, having a first voltage level, e.g., Vddlo, is received, wherein the high power supply voltage, e.g., Vddhi, is higher than the first voltage level, e.g., Vddlo.

At step 706, an output signal, e.g., Vout, having a second voltage level, is supplied, wherein the at least one diode-connected device, e.g., mnd2 and/or mpd2, allows the output signal, e.g., Vout, to be pulled up to about a first diode voltage drop below the high power supply voltage, e.g., Vddhi, and/or to be pulled down to about a second diode voltage drop above ground. The first diode voltage drop and the second diode voltage drop are from the at least one diode-connected device, e.g., mnd2 and mpd2, respectively.

The method can further comprise supplying a bias voltage, e.g., Vdyn_b1, by a dynamic biasing circuit, e.g., 202, to control the pull-up PMOS transistor, e.g., mp2. The method can further comprise supplying a bias voltage, e.g., Vdyn_b2, that is less than the second voltage level, e.g., Vout, by an electrical overstress prevention bias circuit, e.g., 302, to the pull-down NMOS transistor, e.g., mn2, when the output signal, e.g., Vout, is a logical 1. The method can further comprise selecting a number of the at least one diode-connected device from at least two numbers with a control signal.

One aspect of this description relates to an integrated circuit. The integrated circuit includes a pre-driver configured to receive a first high supply voltage and to generate an input signal. The integrated circuit further includes at least one post-driver configured to receive at least one second high supply voltage and to receive the input signal, wherein the at least one second high supply voltage is different from the first high supply voltage. The at least one post-driver further includes an input node configured to receive the input signal and an output node configured to output an output signal. The at least one post-driver further includes a pull-up transistor, wherein the pull-up transistor is configured to be in a conductive state during an entire period of operation and a pull-down transistor. The at least one post-driver further includes at least one diode-connected device coupled between the pull-down transistor and the output node. Each post-driver of the at least one post-driver is configured to receive the input signal having a first voltage level corresponding to a high logic level, and to supply the output signal having a second voltage level corresponding to a high logic level, the second voltage level is higher than the first voltage level.

Another aspect of this description relates to a level shifter. The level shifter includes an input node configured to receive an input signal and an output node configured to output an output signal. The level shifter further includes a pull-up transistor, wherein the pull-up transistor is configured to be in a conductive state during an entire period of operation and a pull-down transistor. The level shifter further includes at least one diode-connected device coupled between the pull-down transistor and the output node. The level shifter further includes an electrical over-stress (EOS) prevention bias circuit. The EOS prevention bias circuit includes a first transistor of a first type, a first transistor of a second type and at least one second diode-connected device connected between the first transistor of the first type and the first transistor of the second type. The level shifter is configured to receive the input signal having a first voltage level corresponding to a high logic level, and to supply the output signal having a second voltage level corresponding to a high logic level, the second voltage level is higher than the first voltage level.

Still another aspect of this description relates to a level shifter. The level shifter includes an input node configured to receive an input signal and an output node configured to output an output signal. The level shifter further includes a pull-up transistor, wherein the pull-up transistor is configured to be in a conductive state during an entire period of operation and a pull-down transistor. The level shifter further includes at least one diode-connected device coupled between the pull-down transistor and the output node. The level shifter further includes a dynamic biasing circuit configured to control the pull-up transistor. The dynamic biasing circuit includes a first transistor of a first type, a first transistor of a second type and at least one second diode-connected device connected between the first transistor of the first type and the first transistor of the second type. The level shifter is configured to receive the input signal having a first voltage level corresponding to a high logic level, and to supply the output signal having a second voltage level corresponding to a high logic level, the second voltage level is higher than the first voltage level.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. An integrated circuit, comprising:
    a pre-driver configured to receive a first high supply voltage and to generate an input signal; and
    at least one post-driver configured to receive at least one second high supply voltage and to receive the input signal, wherein the at least one second high supply voltage is different from the first high supply voltage, the at least one post-driver comprising:
        an input node configured to receive the input signal;
        an output node configured to output an output signal;
        a pull-up transistor, wherein the pull-up transistor is configured to be in a conductive state during an entire period of operation;
        a pull-down transistor; and
        at least one diode-connected device coupled between the pull-down transistor and the output node, wherein the at least one diode-connected device comprises a plurality of pull-down diode stacks electrically coupled between the pull-up transistor and the pull-down transistor, and the plurality of pull-down diode stacks are connected to each other in parallel,
    wherein each post-driver of the at least one post-driver is configured to receive the input signal having a first voltage level corresponding to a high logic level, and to supply the output signal having a second voltage level corresponding to a high logic level, the second voltage level being higher than the first voltage level.

2. The integrated circuit of claim 1, wherein the at least one post-driver comprises a plurality of post-drivers, and each post-driver of the plurality of post-drivers is configured to receive a different high logic level from each other post-driver of the plurality of post-drivers.

3. The integrated circuit of claim 1, wherein the at least one post-driver is configured to receive a plurality of high logic levels.

4. The integrated circuit of claim 1, wherein each pull-down diode stack of the plurality of pull-down diode stacks has a different number of diode-connected transistors from each other pull-down diode stack of the plurality of diode-stacks.

5. The integrated circuit of claim 1, wherein each pull-down diode stack of the plurality of diode stacks is configured to be controlled by a control signal from an encoder circuit.

6. The integrated circuit of claim 1, wherein the at least one post-driver further comprises:
    an electrical over-stress prevention bias circuit, wherein the EOS prevention bias circuit comprises:
        a first transistor of a first type;
        a first transistor of a second type; and
        at least one diode-connected device connected between the first transistor of the first type and the first transistor of the second type.

7. The integrated circuit of claim 1, wherein the at least one post-driver further comprises:
    a dynamic biasing circuit configured to control the pull-up transistor, wherein the dynamic biasing circuit comprises:
        a first transistor of a first type;
        a first transistor of a second type; and
        at least one second diode-connected device connected between the first transistor of the first type and the first transistor of the second type.

8. The level shifter of claim 7, wherein each pull-down diode stack of the plurality of pull-down diode stacks has a different number of diode-connected transistors from each other pull-down diode stack of the plurality of diode-stacks.

9. A level shifter, comprising:
    an input node configured to receive an input signal;
    an output node configured to output an output signal;
    a pull-up transistor, wherein the pull-up transistor is configured to be in a conductive state during an entire period of operation;
    a pull-down transistor;
    at least one diode-connected device coupled between the pull-down transistor and the output node, wherein the at least one diode-connected device comprises a plurality of pull-down diode stacks electrically coupled between the pull-up transistor and the pull-down transistor, and each pull-down diode stack of the plurality of diode stacks is configured to be controlled by a control signal from an encoder circuit; and
    an electrical over-stress prevention bias circuit, wherein the EOS prevention bias circuit comprises:
        a first transistor of a first type;
        a first transistor of a second type; and
        at least one second diode-connected device connected between the first transistor of the first type and the first transistor of the second type,
    wherein the level shifter is configured to receive the input signal having a first voltage level corresponding to a high logic level, and to supply the output signal having a second voltage level corresponding to a high logic level, the second voltage level being higher than the first voltage level.

10. The level shifter of claim 9, wherein the plurality of pull-down diode stacks are connected to each other in parallel.

11. The level shifter of claim 9, further comprising:
    a dynamic biasing circuit configured to control the pull-up transistor; and
    an inverter electrically coupled between the input node and the dynamic biasing circuit.

12. The level shifter of claim 11, wherein the dynamic biasing circuit comprises:
    a first transistor of a first type;
    a first transistor of a second type; and
    at least one second diode-connected device connected between the first transistor of the first type and the first transistor of the second type.

13. A level shifter, comprising:
    an input node configured to receive an input signal;
    an output node configured to output an output signal;
    a pull-up transistor, wherein the pull-up transistor is configured to be in a conductive state during an entire period of operation;
    a pull-down transistor;
    at least one diode-connected device coupled between the pull-down transistor and the output node, wherein the at least one diode-connected device comprises a plurality of pull-down diode stacks electrically coupled in parallel between the pull-up transistor and the pull-down transistor, and each pull-down diode stack of the plurality of pull-down diode stacks has a different number of diode-connected transistors from each other pull-down diode stack of the plurality of diode-stacks; and a dynamic biasing circuit configured to control the pull-up transistor, wherein the dynamic biasing circuit comprises:
  a first transistor of a first type;
  a first transistor of a second type; and
  at least one second diode-connected device connected between the first transistor of the first type and the first transistor of the second type,
wherein the level shifter is configured to receive the input signal having a first voltage level corresponding to a high logic level, and to supply the output signal having a second voltage level corresponding to a high logic level, the second voltage level being higher than the first voltage level.

14. The level shifter of claim 13, further comprising:
an electrical over-stress prevention bias circuit, wherein the EOS prevention bias circuit comprises:
  a first transistor of a first type;
  a first transistor of a second type; and
  at least one second diode-connected device connected between the first transistor of the first type and the first transistor of the second type.

15. The level shifter of claim 13, further comprising:
an inverter electrically coupled between the input node and the dynamic biasing circuit.

* * * * *